(12) United States Patent
Hempel et al.

(10) Patent No.: US 8,735,236 B2
(45) Date of Patent: May 27, 2014

(54) HIGH-K METAL GATE ELECTRODE STRUCTURE FORMED BY REMOVING A WORK FUNCTION ON SIDEWALLS IN REPLACEMENT GATE TECHNOLOGY

(75) Inventors: Klaus Hempel, Dresden (DE); Christopher Prindle, Dresden (DE); Rolf Stephan, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 259 days.

(21) Appl. No.: 13/339,842

(22) Filed: Dec. 29, 2011

(65) Prior Publication Data
US 2013/0168773 A1    Jul. 4, 2013

(51) Int. Cl.
    *H01L 21/338*    (2006.01)
(52) U.S. Cl.
    USPC .................... 438/183; 438/279; 438/275
(58) Field of Classification Search
    CPC ............... H01L 29/66545; H01L 21/28114
    USPC .......................... 439/183, 275.279
    See application file for complete search history.

(56) References Cited

U.S. PATENT DOCUMENTS

| 2010/0078730 A1 | 4/2010 | Yoshida et al. ............... 257/369 |
| 2011/0248359 A1 | 10/2011 | Hwang et al. ................ 257/410 |
| 2012/0319205 A1 | 12/2012 | Hempel et al. ............... 257/368 |

FOREIGN PATENT DOCUMENTS

DE    102011077661 A1    12/2012    .......... H01L 21/8234

OTHER PUBLICATIONS

Translation of Official Communication from German Patent Office for German Patent Application No. 10 2012 213 880.3 dated Jul. 17, 2013.

*Primary Examiner* — Matthew Reames
(74) *Attorney, Agent, or Firm* — Amerson Law Firm, PLLC (57) ABSTRACT

When forming sophisticated high-k metal gate electrode structures on the basis of a replacement gate approach, the fill conditions upon filling in the highly conductive electrode metal, such as aluminum, may be enhanced by removing the final work function metal, for instance a titanium nitride material in P-channel transistors, only preserving a well-defined bottom layer.

17 Claims, 8 Drawing Sheets

HIGH-K METAL GATE ELECTRODE STRUCTURE FORMED BY REMOVING A WORK FUNCTION ON SIDEWALLS IN REPLACEMENT GATE TECHNOLOGY

BACKGROUND OF THE INVENTION

1. Field of the Invention

Generally, the present disclosure relates to the fabrication of sophisticated transistors of integrated circuits that comprise gate electrode structures formed on the basis of a high-k gate dielectric material and work function metals in a replacement gate technology.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, the conductivity of the channel region substantially affects the performance of MOS transistors. Thus, the scaling of the channel length, and associated therewith the reduction of channel resistivity, is a dominant design criterion for accomplishing an increase in the operating speed of the integrated circuits.

Presently, the vast majority of integrated circuits are based on silicon due to its substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of the thin gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm. The relatively high leakage current, however, caused by direct tunneling of charge carriers through an ultra-thin silicon dioxide-based gate insulation layer, may reach values for an oxide thickness in the range of 1-2 nm that may not be compatible with thermal design power requirements for many types of circuits.

Therefore, replacing silicon dioxide-based dielectrics, at least in part, as the material for gate insulation layers has been considered, particularly for devices requiring extremely thin silicon dioxide-based gate dielectric layers. Possible alternative materials include materials that exhibit a significantly higher permittivity so that a physically greater thickness of a correspondingly formed gate insulation layer results in a capacitive coupling that would otherwise only be obtained by an extremely thin silicon dioxide layer.

Additionally, transistor performance may be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides increased capacitance based on the same thickness as a silicon dioxide-based layer, while additionally maintaining leakage currents at an acceptable level. On the other hand, the non-polysilicon material, such as titanium nitride and the like, in combination with other metals, may be formed so as to connect to the high-k dielectric material, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that, after the formation of the sophisticated high-k metal gate stack, the sensitive gate materials have to be reliably encapsulated throughout the further process sequence, which, however, turns out to be difficult to achieve.

For this reason, in other approaches, the initial gate electrode stack may be provided with a high degree of compatibility with conventional polysilicon-based process strategies and the actual electrode metal and the final adjustment of the work function of the gate electrode structures may be accomplished in a very advanced manufacturing stage, i.e., after completing the basic transistor structure.

A corresponding manufacturing strategy is also referred to as a replacement gate approach or technology in which at least the adjustment of the work function, i.e., the incorporation of appropriate work function metal species, is accomplished in a very late manufacturing stage. Furthermore, in some cases, the high-k dielectric material may be formed upon patterning the gate electrode structure, thereby avoiding the deposition of the high-k dielectric material, possibly in combination with an additional very thin silicon oxide material in a very late manufacturing stage. In other cases, a so-called full replacement approach may be applied by forming the high-k dielectric material in a late manufacturing stage together with the work function metal species and the actual electrode metal. Generally, the replacement gate strategy is a very promising technology, wherein, however, upon further scaling the transistor dimensions and thus the gate length, increasingly deposition-related irregularities are caused upon filling in the actual electrode metal, as will be explained in more detail with reference to FIG. 1.

Figure 1:
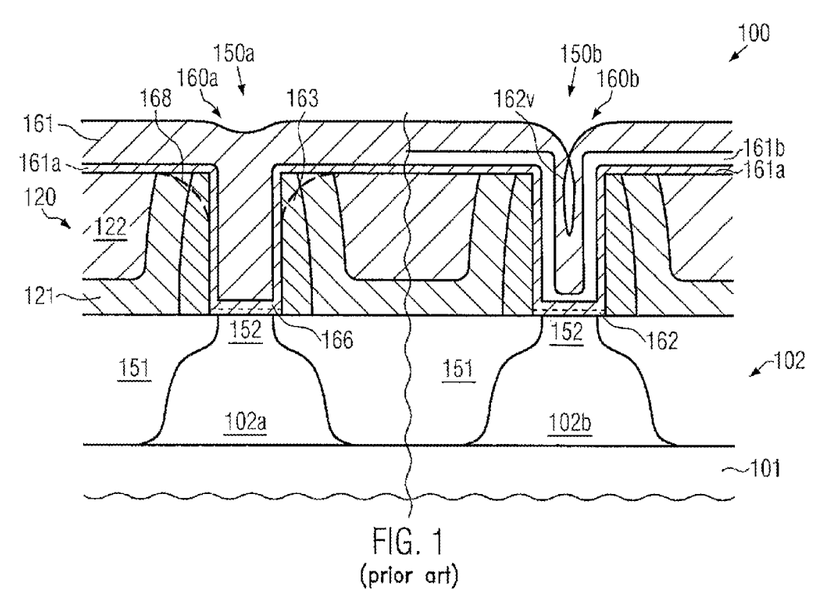
FIG. 1 schematically illustrates a cross-sectional view of a sophisticated semiconductor device during a final phase of a replacement gate approach performed on the basis of conventional process strategies.

FIG. 1 schematically illustrates a cross-sectional view of a semiconductor device 100 in a final stage of a replacement gate approach. As shown, the device 100 comprises a substrate 101, such as a semiconductor material or any other appropriate carrier material for forming thereon a semiconductor layer 102, such as a silicon layer, a silicon/germanium layer and the like. The semiconductor layer 102 is typically divided into a plurality of semiconductor regions or active regions on the basis of appropriate isolation structures (not shown) in order to define the lateral size and positions for forming transistor elements. For example, in FIG. 1, a first active region 102a, which may correspond to an N-channel transistor 150a, and a second active region 102b, corresponding to a P-channel transistor 150B, are depicted. In this manufacturing stage, the transistors 150a, 150b comprise drain and source regions 151 and a channel region 152 having appropriate dopant profiles so as to correspond to the characteristics of the transistors 150a, 150b. Furthermore, a contact level 120 is provided in an intermediate manufacturing stage and may comprise appropriate dielectric materials, such as a dielectric layer 121 and a dielectric layer 122, which are typically provided in the form of silicon nitride and silicon dioxide, respectively. The dielectric materials 122, 121 laterally enclose gate electrode structures 160a, 160b of the transistors 150a, 150b, respectively.

As discussed above, initially the gate electrode structures 160a, 160b may be provided in the form of well-established polysilicon/silicon dioxide gate electrode structures wherein at least the polysilicon material has been removed and is thus replaced by an appropriate material system. For example, a first layer 161a is illustrated and is to represent at least a metal-containing electrode material, while, in some cases, the layer 161a may also include a high-k dielectric material, possibly in combination with an oxide layer 166, while, in other cases, as discussed above, the layer 166 may represent a high-k dielectric material provided in an early manufacturing stage, possibly in combination with an additional conventional dielectric material (not shown). The layer 161a typically comprises an appropriate work function metal species, such as lanthanum and the like, possibly in combination with titanium nitride, wherein at least one conductive barrier or etch stop layer, such as tantalum nitride, is provided so as to protect and passivate any underlying materials. Furthermore, the layer 161a is also provided in the gate electrode structure 160b in combination with a second metal-containing electrode material 161b, which may be provided in the form of titanium nitride. The layer 161b ensures a desired work function of the gate electrode structure 150b in combination with the previously provided material layer 161a. Moreover, in the manufacturing stage shown, an electrode metal 162, such as aluminum and the like, is formed in the gate electrode structures 160a, 160b which, however, may result in deposition-related irregularities, such as a void 162v, in particular in the gate electrode structure 160b, which has a reduced width for filling in the electrode metal 162 due to the presence of the layer 161b.

The semiconductor device 100 as illustrated in FIG. 1 may be formed on the basis of the following process strategy. In an early phase, the active regions 102a, 102b are formed by incorporating appropriate dopant species for defining the basic characteristics of the transistors 150a, 150b, while the lateral position, size and shape of the active regions 102a, 102b is determined by providing an appropriate isolation structure (not shown), such as a shallow trench isolation. To this end, well-established manufacturing techniques, including implantation processes and masking regimes for incorporating an appropriate well dopant species, may be applied, while the isolation structures may be formed by using sophisticated lithography, etch, deposition, anneal and planarization techniques. Thereafter, the gate electrode structures 160a, 160b are formed in an initial and, thus, preliminary state by, for instance, forming an appropriate silicon dioxide-based dielectric material, followed by polysilicon material and any additional sacrificial materials, such as hard mask materials and the like, as are required for patterning the gate electrode structures 160a, 160b in compliance with the overall design rules of the device 100. For example, in sophisticated applications, a gate length of 40 nm and less has to be implemented, wherein sophisticated transistors may even require a gate length of 30 nm and less in the device 100. Thereafter, the processing is continued by, for instance, forming a spacer structure 163 and also providing the drain and source regions 151 using well-established process techniques, such as implantation processes, selective epitaxial growth techniques and the like. If required, anneal processes are applied in order to activate dopant species and re-crystallize implantation-induced damage.

Next, the contact level 120 is formed by depositing the materials 121, 122, for instance by applying chemical vapor deposition (CVD) techniques, spin-on techniques and the like, possibly in combination with planarization processes in order to provide a planar surface. Thereafter, any excess material is removed so as to finally expose a surface of the placeholder material, i.e., of the polysilicon material, which is then removed by using highly selective etch recipes, thereby forming respective openings in the gate electrode structures 160a, 160b. Thereafter, the layer 161a is deposited, for instance, by using very conformal CVD-like deposition techniques, such as atomic layer deposition (ALD), which may include the deposition of a high-k dielectric material, as discussed above, while in other cases a corresponding high-k dielectric material may have been formed in an early manufacturing stage. The deposition of the layer 161a comprises the deposition of at least one metal-containing electrode material, such as tantalum nitride, that is formed in a highly conformal manner so as to act as an etch stop material without unduly deteriorating the overall electronic characteristics and conductivity of the gate electrode structures 160a, 160b. As discussed above, when realizing a gate length of 40 nm and significantly less, the material layer 161a, possibly including the high-k dielectric material, has to be deposited into a high aspect ratio opening obtained by the removal of the placeholder material. Typically, the layer 161a is formed with a thickness of several nm when comprising a high-k dielectric material and an appropriate work function adjusting material layer. Consequently, upon forming the layer 161b, for instance in the form of a titanium nitride material, which may have to be provided with a significantly increased thickness of up to 5 nm and more, in order to obtain the required electronic characteristics of the gate electrode structure 160b, even more sophisticated deposition conditions are encountered during the deposition of the layer 161b. To this end, highly conformal deposition recipes are applied, for instance on the basis of ALD and the like. Next, typically, appropriate lithography techniques and etch strategies are applied so as to selectively remove the layer 161b from the gate electrode structure 160a. Thereafter, the processing is continued by depositing the electrode metal 162, for instance in the form of aluminum. Due to the previous deposition of the layer 161b, however, the resulting width of the gate opening of the gate electrode structure 160b is significantly reduced, for instance by approximately 10 nm for a layer thickness of 5 nm, thereby significantly increasing the probability of creating voids 162v in the gate electrode structure 160b, which in turn has a pronounced impact on the overall characteristics of the transistor 150b, which may even result in a total failure of the transistor 150b.

In an attempt to completely fill the gate electrode structures 160a, 160b, it has been suggested to use CVD deposition of aluminum, which, however, may require an additional titanium seed layer, which may cause a non-desired overhang at the top of the gate structures, thereby even further reducing the available gap width, in particular in the gate electrode structure 160b, upon depositing the actual electrode metal 162. Since it is extremely difficult to completely fill the gate electrode structures having an aspect ratio, i.e., a ratio of length of the corresponding gate openings with respect to the depth thereof, of up to 10, other strategies have been proposed in order to reduce the sophisticated aspect ratio. For example, in some conventional approaches, it has been proposed to reduce the aspect ratio by increasing the width of the gate openings, for instance upon or after removing the placeholder material by using appropriate material erosion processes, such as plasma assisted etch processes, ion sputtering techniques and the like. In this manner a substantially tapered cross-sectional shape of the corresponding gate openings, as indicated by 168, may be obtained thereby significantly reducing the complexity of the subsequent deposition processes. In this manner, even the initially high aspect ratio openings may be reliably filled with the electrode metal 162. Since the tapered portion 168 may, however, result in a significantly increased gate length at the upper portions of the gate electrode structures 160a, 160b, in particular in densely packed device areas, this increased gate length may be in conflict with a contact regime in which contact elements are to be formed in the contact level 120 adjacent to the gate electrode structures 160a, 160b so as to connect to the drain and/or source regions 151. In this case, an increased pitch between closely spaced gate electrode structures have to be implemented, thereby significantly increasing the overall lateral size of complex semiconductor devices.

In other approaches, "non-conformal" deposition techniques have been proposed, such as physical vapor deposition (PVD) techniques, in which material is preferably deposited at the bottom of an opening, while a significantly reduced thickness is formed on sidewall surface areas. Such deposition techniques, however, may suffer from a significant dependency on the aspect ratio, while also the deposition uniformity is very limited so that frequently a reduced thickness of the titanium nitride material is observed at the bottom corners and edges of the gate electrode structures. In particular in transistors with reduced width, the influence of such non-uniformities of the work function may increasingly influence the final transistor characteristics. Moreover, the PVD technique may result in the creation of overhangs at the top of the gate openings, which may thus negatively impact the following deposition of the electrode metal, unless a further material erosion process is implemented. Hence, in total, this approach may suffer from reduced process robustness and uniformity, which in turn may result in a high degree of variability of transistor characteristics.

In German Patent Application No. 10 2011 077 661.3, "High-k Metal Gate Electrode Structures Formed by Reducing a Gate Fill Aspect Ratio in Replacement Gate Technology," by Hempel et al., filed by Applicant of the present application, another approach is proposed in order to reduce the aspect ratio. In this concept, in an upper part of the gate opening, the titanium nitride material is removed on the basis of a sacrificial fill material, while the titanium nitride material is preserved at the lower portion of the gate electrode structure and on a significant portion of the sidewall areas. Hence, in this strategy, a similar effect is obtained as in the above-described concept of locally tapering the upper portion of the gate electrode structures, however, without actually increasing the finally achieved gate length in the upper portion of the gate electrode structures. Furthermore, in this strategy, the reduction of the aspect ratio is restricted to one type of gate electrode structures. Generally, this may provide superior fill conditions without actually increasing the probability of creating leakage paths, in particular for closely spaced gate electrode structures. The reliable fill of the highly conductive electrode metal, however, down to the bottom of the gate electrode structures, may still be difficult to achieve due to the presence of the titanium nitride material on significant portions of the sidewalls of the gate electrode structures.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally contemplates semiconductor devices and manufacturing techniques in which an electrode metal may be filled into gate openings by removing a significant part of a relatively thick metal-containing electrode material used for adjusting the work function of the gate electrode structure under consideration. That is, a bottom layer of the electrode material is preserved so as to enable a reliable adjustment of the work function, wherein a desired minimum thickness of the electrode material is provided across the entire gate electrode structure. On the other hand, the electrode metal may be filled into the gate opening and on the bottom layer on the basis of superior deposition conditions, since the electrode material is only present at and in the vicinity of the bottom of the gate opening, thereby not unduly affecting the material deposition of the actual electrode metal, such as aluminum and the like. That is, the metal-containing electrode material, such as a titanium nitride material, is required at the bottom of the gate electrode structure only in order to appropriately adjust the work function, so that the selective removal of this material from the remaining portion of the gate electrode structure may significantly reduce the aspect ratio without changing the electronic characteristics.

In some illustrative embodiments, the selective provision of the bottom layer for adjusting the work function may be accomplished on the basis of a process sequence without requiring any additional lithography steps. In this manner, superior fill conditions may be achieved, even for transistor devices requiring a gate length of 40 nm and less, without affecting the overall electronic characteristics and without unduly contributing to additional process complexity.

In some illustrative aspects disclosed herein, the electrode material for adjusting the work function of one type of gate electrode structures may be deposited on the basis of a highly conformal deposition technique, such as ALD, so as to provide a well-defined initial layer thickness, wherein this layer is efficiently removed from significant portions of the sidewalls so as to ensure at least the initial layer thickness at corners and edges at the bottom of the gate opening. To this end, a sacrificial material with a well-defined height or thickness may be formed in the gate opening so as to reliably protect the bottom layer, wherein the well-defined thickness of the sacrificial material also guarantees that at least the initial thickness of the bottom layer is preserved at the edges and corners.

In other illustrative aspects disclosed herein, the electrode material for adjusting the work function of the gate electrode structure under consideration is provided on the basis of a deposition technique that allows reliable complete filling of the gate opening, while subsequently a highly controlled etch process may be applied so as to preserve the bottom layer with a desired thickness and with a high degree of uniformity across the entire gate electrode structure. On the other hand, the electrode material may be reliably completely removed from any other type of gate electrode structures.

One illustrative method disclosed herein comprises conformally forming a layer of a metal-containing electrode material with a first thickness in a gate opening of a first gate electrode structure of a first transistor and a gate opening of a second gate electrode structure of a second transistor. The method further comprises forming a sacrificial material selectively at a bottom of the gate opening of the second gate electrode structure, wherein the sacrificial material has a second thickness that is less than three times the first thickness. Furthermore, the method comprises removing a portion of the layer of a metal-containing electrode material from the gate opening of the first gate electrode structure while using the sacrificial material as an etch mask so as to preserve the layer of a metal-containing electrode material with the first thickness at the bottom of the gate opening of the second gate electrode structure. The method additionally comprises removing the sacrificial material from the gate opening of the second gate electrode structure. Moreover, the method comprises forming a conductive fill material in the gate openings of the first and second gate electrode structures.

A further illustrative method disclosed herein comprises forming a gate opening in a first gate electrode structure and a second gate electrode structure of a semiconductor device. The method further comprises forming a first metal-containing material layer on surface areas of the gate opening of the first and second gate electrode structures. Furthermore, a second metal-containing material is formed on the first metal-containing material layer so as to completely fill the gate openings of the first and second gate electrode structures. The method further comprises removing the second metal-containing material from the gate opening of the first gate electrode structure by using the first metal-containing electrode material layer as an etch stop. Additionally, the method comprises removing a portion of the second metal-containing electrode material from the gate opening of the second gate electrode structure so as to preserve a bottom layer of the second metal-containing electrode material. Moreover, the method comprises forming an electrode metal on the first metal-containing material layer in the gate opening of the first gate electrode structure and on the bottom layer in the gate opening of the second gate electrode structure.

One illustrative semiconductor device disclosed herein comprises a first transistor comprising a first gate electrode structure. The first gate electrode structure comprises a first electrode metal formed on a metal-containing electrode material of a first type and is laterally enclosed by the metal-containing electrode material of the first type. The semiconductor device further comprises a second transistor comprising a second gate electrode structure. The second gate electrode structure comprises a second electrode metal formed on a bottom layer of a metal-containing electrode material of a second type, wherein the bottom layer has a maximum thickness across the second gate electrode structure that is 10 nm or less.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques and semiconductor devices in which the gap width of a gate opening in a final stage of a replacement gate approach may be increased by removing a final metal-containing electrode material used for adjusting the work function of one type of gate electrode structures on significant portions of the sidewalls so as to preserve a well-defined bottom layer. In this manner, substantially similar deposition conditions may be provided for any type of gate electrode structure upon depositing the highly conductive fill metal on the basis of any desired deposition technique, while on the other hand, by preserving the bottom layer of the metal-containing electrode material in the gate electrode structure under consideration, the electronic characteristics thereof are substantially not affected since the final work function is substantially determined by the bottom layer of the metal-containing electrode material. For example, frequently, the final work function adjustment of one type of transistor is accomplished by a metal-containing electrode material, for instance for a P-channel transistor, that has to be provided with an increased thickness of up to several nanometers, which in turn may significantly reduce the available gap width of the gate opening for the final deposition step for filling in the highly conductive electrode metal. In this case, the aspect ratio of the resulting gate opening may be reduced by removing most of this electrode material from the gate opening in such a manner that a reliable bottom layer of this electrode material is preserved.

For example, in some illustrative embodiments, a sacrificial fill material is provided in the gate opening with a height that is selected in accordance with the layer thickness of the electrode material in order to enable the removal of the electrode material from other gate openings and from within the gate opening under consideration, while concurrently a bottom layer is preserved and the well-defined thickness of the sacrificial fill material also guarantees that the thickness of the bottom layer at the edge of the gate opening is equal to or greater than a thickness at the central area of the gate electrode structure. On the other hand, the well-defined thickness of the sacrificial fill material guarantees that a thickness at the edge areas is less than three times the initial layer thickness of the electrode material, and, in some illustrative embodiments, this thickness is less than two times the initial layer thickness. Consequently, uniform electronic characteristics are obtained across the entire gate electrode structure.

In other illustrative embodiments disclosed herein, the electrode material under consideration may be selectively preserved in gate electrode structures by initially completely filling the gate openings with the electrode material under consideration and then subsequently removing the electrode material on the basis of a highly controlled removal process so as to remove this material completely from one type of gate electrode structures, while preserving a well-defined bottom layer in another type of gate electrode structures.

With reference to FIGS. 2a-2m, further illustrative embodiments will now be described in more detail, wherein reference may also be made to FIG. 1, if appropriate.

Figure 2A:
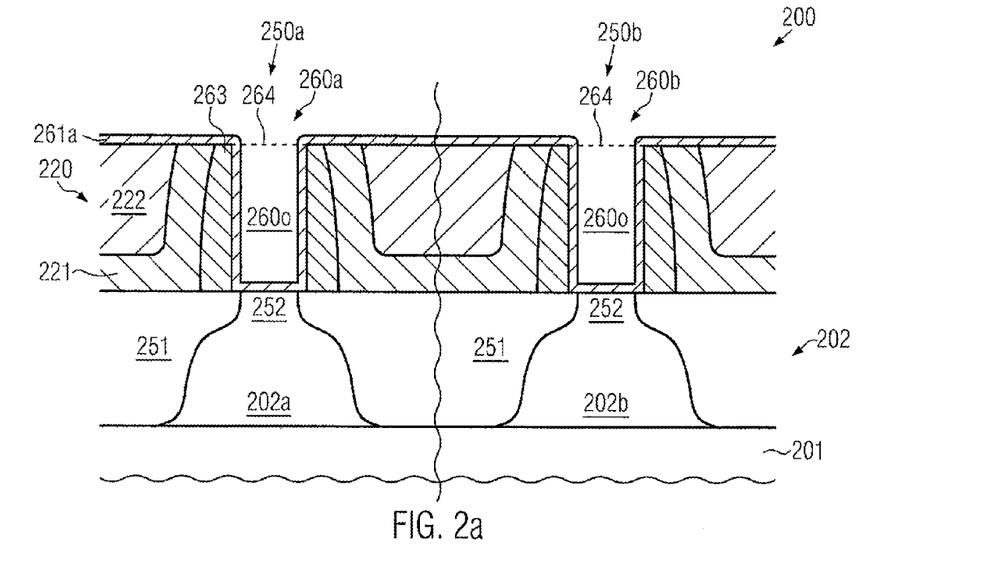
FIGS. 2*a*-2*h* schematically illustrate cross-sectional views of a semiconductor device during various manufacturing stages when forming sophisticated high-k metal gate electrode structures on the basis of a replacement gate technology with superior fill conditions for providing the highly conductive electrode metal, according to illustrative embodiments.

FIG. 2a schematically illustrates a cross-sectional view of a semiconductor device 200 in an advanced manufacturing stage. As shown, the device 200 may comprise a substrate 201 and a semiconductor layer 202 formed thereon, wherein these components may have any appropriate configuration, as, for instance, also discussed above with reference to the device 100. For example, the semiconductor layer 202 and the substrate 201 may form a bulk configuration in which the semiconductor layer 202 is directly connected to a crystalline material of the substrate 201. In other cases the layer 202 and the substrate 201 may form a silicon-on-insulator (SOI) architecture when a buried insulating material (not shown) is formed directly below the semiconductor layer 202. The layer 202 is divided into a plurality of active regions 202a, 202b, which may be accomplished by providing appropriate isolation structures (not shown), as is also discussed above with reference to the device 100. For convenience, a first active region 202a and a second active region 202b are illustrated, which, in some illustrative embodiments, may correspond to a first transistor 250a, such as an N-channel transistor, and a second transistor 250b, such as a P-channel transistor. In the manufacturing stage shown, the transistors 250a, 250b may comprise drain and source regions 251, a channel region 252 and gate electrode structures 260a, 260b, respectively. The gate electrode structures 260a, 260b are laterally embedded in a device level 220, which in the manufacturing stage shown may be provided in the form of an appropriate dielectric material system, for instance comprising a dielectric layer 221 and an interlayer dielectric material 222. It should be appreciated that the transistors 250a, 250b may have incorporated therein any appropriate mechanism for further enhancing the overall performance, for instance in the form of any embedded semiconductor alloys, for instance for incorporating an appropriate dopant profile and/or for inducing a desired type of strain in the channel regions 252 and the like. Moreover, in the example shown, the transistors 250a, 250b may represent planar transistor architectures, while, in other cases, in addition or alternatively to planar transistors, also three-dimensional transistors such as multiple gate transistors or FinFET transistors may be provided. In this case, the gate electrode structures 260a, 260b may extend into the semiconductor layer 202 at certain areas of the device, thereby even further contributing to a pronounced and sophisticated surface topography during the further processing of the device 200. The components of the semiconductor device 200 described so far may be formed on the basis of any appropriate process strategy, for instance by using techniques as are also discussed above with reference to the semiconductor device 100. That is, the basic transistor configuration as shown in FIG. 2a may be formed on the basis of a conventional gate electrode structure, i.e., on the basis of an appropriate placeholder material 264, such as polysilicon, silicon/germanium and the like, possibly in combination with one or more additional dielectric cap materials (not shown) so as to adjust the required gate length, i.e., in FIG. 2a, the horizontal extension of the gate electrode structures 260a between a corresponding sidewall spacer structure 263. After performing any high temperature processes and possibly after forming additional contact areas in the drain and source regions 251, for instance in the form of metal silicide regions (not shown) if considered appropriate, the processing is continued by forming the device level 220 and removing any excess material, thereby finally exposing a surface of the placeholder material 264. On the basis of well-established highly selective etch recipes, the material 264 may be removed, thereby forming the gate openings 260o, the width of which may be substantially determined by the spacer structure 263. It should be appreciated that the "width" of the openings 260o may substantially represent the length of the gate electrode structures 260a, 260b except for an additional layer thickness of a high-k dielectric material, which in some illustrative embodiments may be formed on exposed surface areas of the opening 260o. To this end, well-established highly conformal CVD-like deposition techniques, such as ALD, may be used. In this manner, an appropriate high-k dielectric material (not shown) may be deposited, wherein the deposition process may be preceded by forming an oxide layer on the surface of the channel region 252, for instance on the basis of wet chemical oxidation recipes and the like. In other approaches, as for instance also discussed above with reference to the semiconductor device 100, a high-k dielectric material may be provided in an early manufacturing stage and may be preserved upon forming the gate opening 260o so that a deposition of any further dielectric material may not be required in this manufacturing stage.

Thereafter, a layer or layer system 261a is formed, for instance by highly conformal deposition techniques, wherein appropriate work function metal species and at least one metal-containing electrode material, which may also act as an etch stop or barrier layer, may be provided. To this end, highly conformal ALD techniques may be used, as for instance discussed above with reference to the device 100, while, in other cases, any other appropriate deposition recipe may be applied, such as electrochemical deposition processes and the like. Consequently, the metal-containing electrode material 261a may be formed with a desired thickness on any exposed surface areas and thus within the gate openings 260o wherein, as discussed above, any additional layer or layers may be formed, such as a high-k dielectric material, prior to forming the metal-containing electrode material.

Figure 2B:
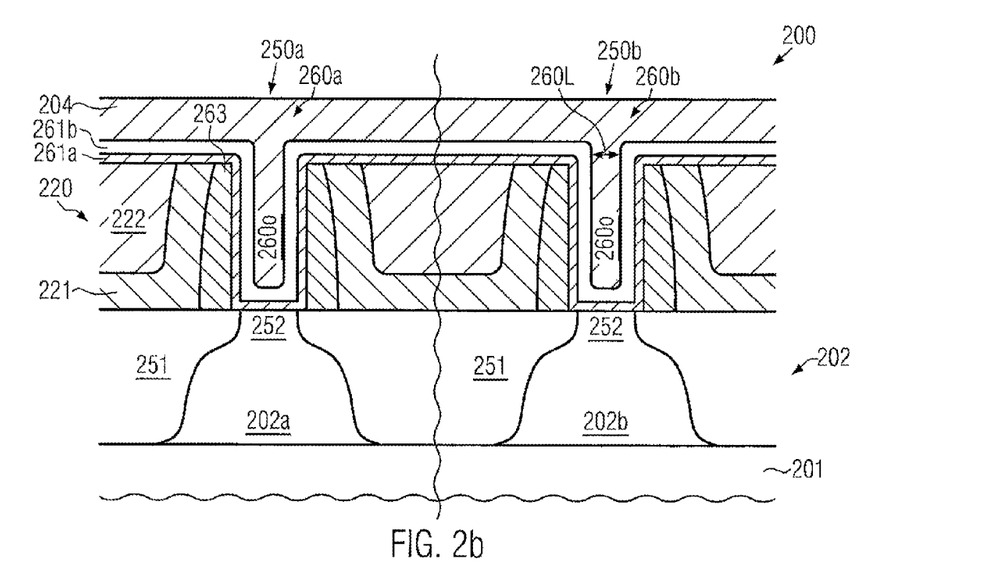

FIG. 2b schematically illustrates the device 200 in a further advanced manufacturing stage. As shown, a second metal-containing electrode material 261b, for instance in the form of titanium nitride and the like, possibly including an additional work function metal species, may be formed on the layer 261a and may have any appropriate thickness, for instance in the range of one to several nanometers, thereby restricting the width or length of the opening 260o, as indicated by 260L. Furthermore, in the manufacturing stage shown, a sacrificial material 204 may be formed in the gate openings 260o and above the contact level 220. The sacrificial material 204 may be provided in a low viscous state so as to obtain a substantially planar surface topography, which may also provide superior conditions for a subsequent lithography process to be applied so as to selectively remove the material 261b at least from the gate opening 260o. To this end, a plurality of well-established materials are available, such as ACCUFELL™ or DUO™, while also other appropriate optical planarization materials may be used.

Figure 2C:
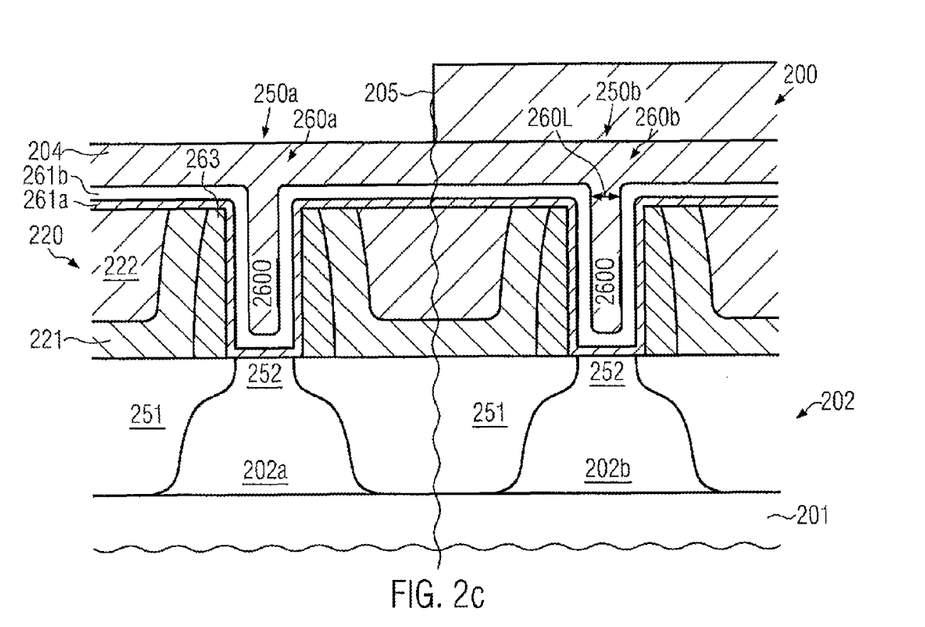

FIG. 2c schematically illustrates the device 200 in a further advanced manufacturing stage. As shown, a further sacrificial material in the form of a mask 205 may be formed so as to cover the transistor 250b and expose the transistor 250a, i.e., the sacrificial fill material 204 formed thereabove. The mask 205 may be provided in the form of a resist mask, which may include the deposition of an appropriate resist material and patterning the same by performing a lithography process and developing the exposed resist material to obtain the mask 205.

Figure 2D:
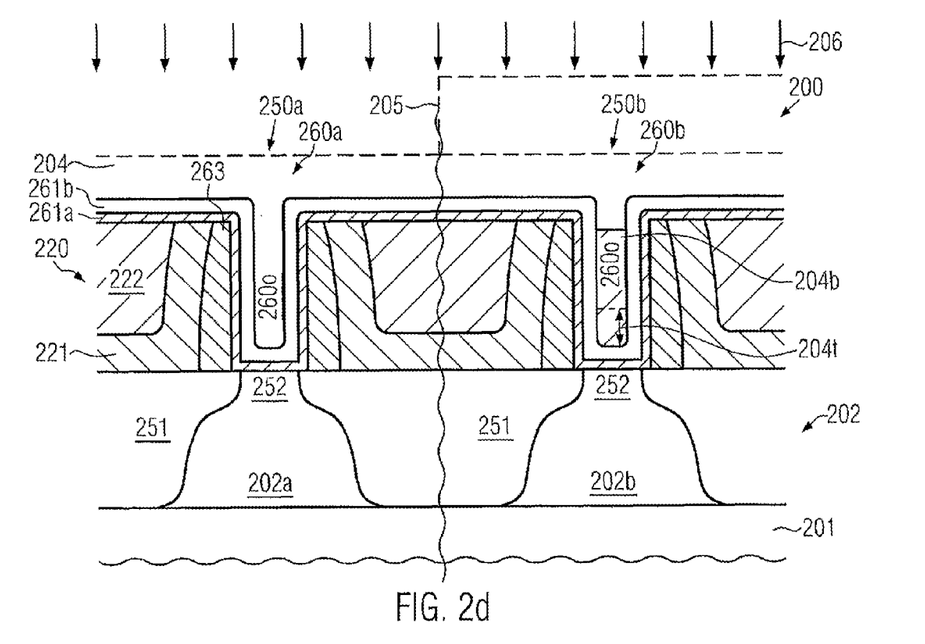

FIG. 2d schematically illustrates the device 200 in a further advanced manufacturing stage according to some illustrative embodiments. In this case, the device 200 may be exposed to an etch ambient 206 established on the basis of a plasma. For example, the etch process 206 may be established on the basis of an appropriate reactive gas component, such as a carbon and fluorine-containing gas, possibly in combination with additional gas components, such as carbon oxide, argon, oxygen and nitrogen. For example, a reactive plasma ambient may be established on the basis of $C_4F_8/CO/Ar/O_2/N_2$ or the removal process 206 may be performed on the basis of a heat oxygen plasma. By using the specific plasma recipes, in some illustrative embodiments, the process parameters may be adjusted such that material of the mask 205 and material of the layer 204 may be commonly removed with substantially the same removal rate. In this case, the material 204 may be substantially completely removed from the gate opening 260o of the gate electrode structure 260a, while it is ensured that a portion 204b is still preserved in the gate opening 260o of the gate electrode structure 250b. FIG. 2d illustrates an intermediate phase of the removal process 206, wherein process parameters and the initial thickness of the material 204 and of the etch mask 205 are selected such that a height of the portion 204b is well above a height or thickness 204t as required for the sacrificial material 204b in order to remove most of the electrode material 261b while nevertheless preserving a bottom layer having at least a minimum thickness at the edges of the gate electrode structure 250b.

Consequently, for given process parameters and given height and thickness of the layers 204 and 205, an appropriate "over etch time" may be selected so as to achieve the desired target height or thickness 204t. It should be appreciated that generally the removal rate of the materials 204, 205 may be readily determined in advance, for instance by experiments and the like, and hence, for a given thickness of the layers 204, 205 and the determined removal rate, the etch process 206 may be controlled on the basis of the overall process time in order to achieve the target height or thickness 204t within an acceptable range of process tolerances, such as ±2 nm.

Figure 2E:
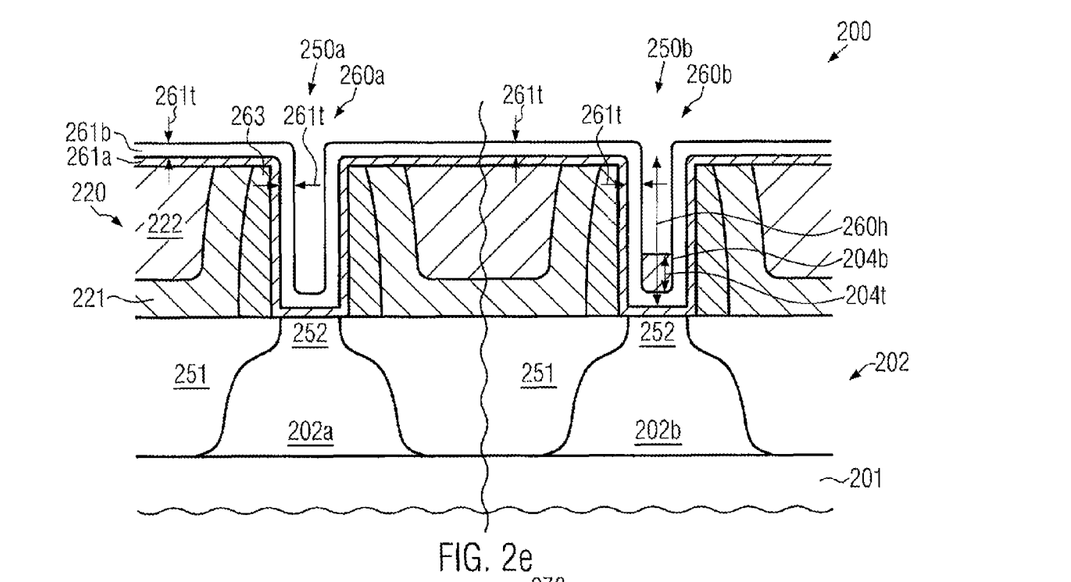

FIG. 2e schematically illustrates the semiconductor device 200 after the well controlled etch process 206 (FIG. 2d), wherein the portion 204b of the sacrificial fill material is preserved with a thickness or height, which is adjusted on the basis of the target height 204t. In some illustrative embodiments, an initial thickness 261t of the layer 261b may be in the range of 4-8 nm, for instance approximately 5 nm, wherein the thickness may be highly uniform due to the conformal deposition technique applied. In order to preserve at least the desired initial layer thickness at the bottom of the gate electrode structure 260b, the height or thickness 204t is selected such that, upon removing most of the material of the layer 261b from the gate electrode structure 260b and removing the layer 261b completely from the gate electrode structure 260a, the isotropic etch behavior still preserves the desired minimum thickness at sidewalls of the gate opening of the gate electrode structure 260b. In some illustrative embodiments the thickness 204t is selected to be less than three times the initial thickness 261t and is equal to or greater than two times the initial thickness 261t. For example, if the thickness 261t is adjusted to approximately 5 nm, in some illustrative embodiments, the height or thickness 204t is selected to be equal to or greater than approximately 2×5 nm, i.e., approximately 10 nm. On the other hand, by restricting the thickness 204t to less than 15 nm, undue coverage of the sidewalls of the gate electrode structure 260b by material of the layer 261b may be avoided.

For example, in highly sophisticated applications, a fill height in the gate electrode structure 260b may be approximately 25-30 nm for a gate length of approximately 25 nm, so that, for a thickness of the layer 261b as specified above, an improvement, i.e., enlargement, of the remaining volume to be filled with a highly conductive electrode metal is approximately 60% compared to the conventional approach as shown in FIG. 1.

Figure 2F:
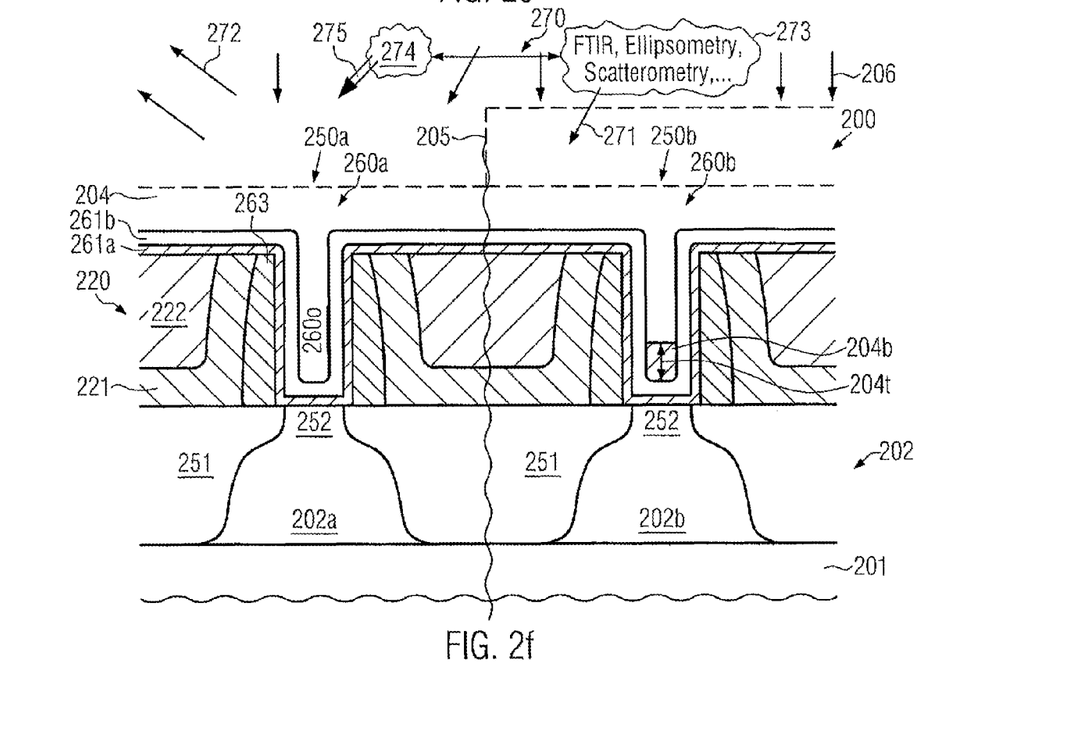

FIG. 2f schematically illustrates the semiconductor device 200 according to further illustrative embodiments in which an additional control mechanism 270 is implemented in order to provide superior process robustness in adjusting the final height or thickness 204t of the sacrificial material 204b within the opening 260o of the gate electrode structure 260b. As illustrated, in some embodiments, the control mechanism 270 may comprise optical detection techniques, in which incoming radiation 271 is reflected or scattered by the device 200 so as to produce scattered or reflected radiation 272, which in turn may be received by any appropriate detector. For convenience, any sources for emitting and receiving the radiations 271 and 272, respectively, are indicated as 273, which may thus represent well-established metrology instruments, such as tools used for elipsometry, scatterometry, FTIR (Fourier transformed infrared spectroscopy) and the like. The metrology system or tools 273 may thus provide measurement information that may be provided to a controller 274, which is appropriately configured to control at least one process parameter of the etch process 206. For example, as indicated above, if the overall process time is to be used as an efficient process parameter for controlling the etch process 206 and thus adjusting the final thickness 204t, the controller 274 is configured to appropriately discontinue the supply of any precursor gases, the plasma power, and the like in order to stop the etch process. In other cases, any other process parameter may be controlled.

The metrology system 273 may thus determine the thickness of one or both of the layers 204, 205, at least at two different points in time, so as to enable the determination of a corresponding removal rate of the process 206, from which the controller 274 may then determine a corresponding target process time or a target value for any other process parameter to be controlled in order to obtain the desired thickness 204t. In this manner, the etch process 206 is endowed with superior process robustness with respect to variations of the etch atmosphere and the initial thickness of the materials 204, 205. In some illustrative embodiments, the control mechanism 270 is implemented such that measurement data are established from one or more substrates 201, while any re-adjustment of process parameters is effective for one or more of the substrates 201. In other illustrative embodiments the control mechanism 270 may be implemented in the form of a "real-time" mechanism, in which the etch process 206 performed on one and the same substrate 201 is controlled by the mechanism 270, thereby providing superior robustness for each individual substrate 201.

Figure 2G:
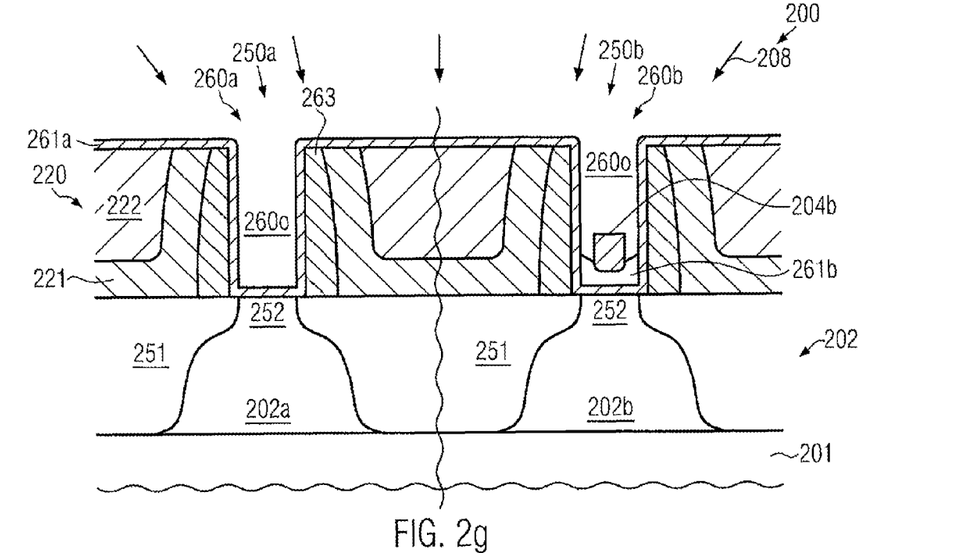

FIG. 2g schematically illustrates the semiconductor device 200 in a further advanced manufacturing stage. As shown, a further etch process 208 may be applied so as to remove exposed portions of the layer 261b (FIG. 2f). For example, in some illustrative embodiments, the layer 261b may be comprised of titanium nitride, which may be efficiently removed on the basis of SPM or SPM/$H_2O_2$ mixture, which is highly selective to the sacrificial material 204b, silicon dioxide, silicon nitride and tantalum nitride, which may be provided in the layer 261a, as discussed above. In order to improve overall controllability of the etch process 208, the recipe and/or process parameters, such as temperature, based on the above specified agents may be selected so as to obtain a moderately low removal rate, for instance 1 nm/m or less so that a certain degree of process time variation may not result in undue "over etch" of the material 261b at sidewalls of the gate opening 260o of the gate electrode structure 260b. In this manner, it may be guaranteed, in combination with the highly controlled etch process 206 (FIGS. 2d-2f) as described above, that the thickness or height level of the material 261 at sidewalls of the gate electrode structure 260b is slightly above the initial layer thickness of the material 261b. In this manner, the remaining material 261b forms a bottom layer having at least the desired thickness in order to uniformly provide the electronic characteristics of the gate electrode structure 260b, since the slightly greater thickness at the sidewalls of the gate electrode structure ensures that the work function is uniformly adjusted across the entire gate electrode structure 260b.

During the etch process 208, the remaining portion 204b may be converted into an oxide-like material, which may be subsequently removed by HF and the like, as discussed above. In other illustrative embodiments, the exposed portion of the layer 261b may be efficiently removed by using a wet chemistry on the basis of hydrogen peroxide at elevated temperatures, for instance at a temperature of 40-80° C., for instance at approximately 50° C. Also in this case, the remaining portion 204b of the sacrificial fill material may be converted into an oxide-like material, which may then be removed in a later manufacturing stage, for instance by diluted HF and the like.

Hence, in some illustrative embodiments, a wet chemical etch process may be applied so as to remove the sacrificial fill material 204b from the gate opening 260o of the gate electrode structure 260b. For example, as discussed above, the corresponding etch process may be performed on the basis of HF, which may thus efficiently remove the modified material 204b, while nevertheless a high degree of selectivity is achieved with respect to materials such as titanium nitride, tantalum nitride, the interlayer dielectric material and the like. Any further sacrificial material that has not been converted into a silicon oxide like material during the previous etch process 208 may be removed by other wet chemical agents, such as ACT970, that is commercially available.

Figure 2H:
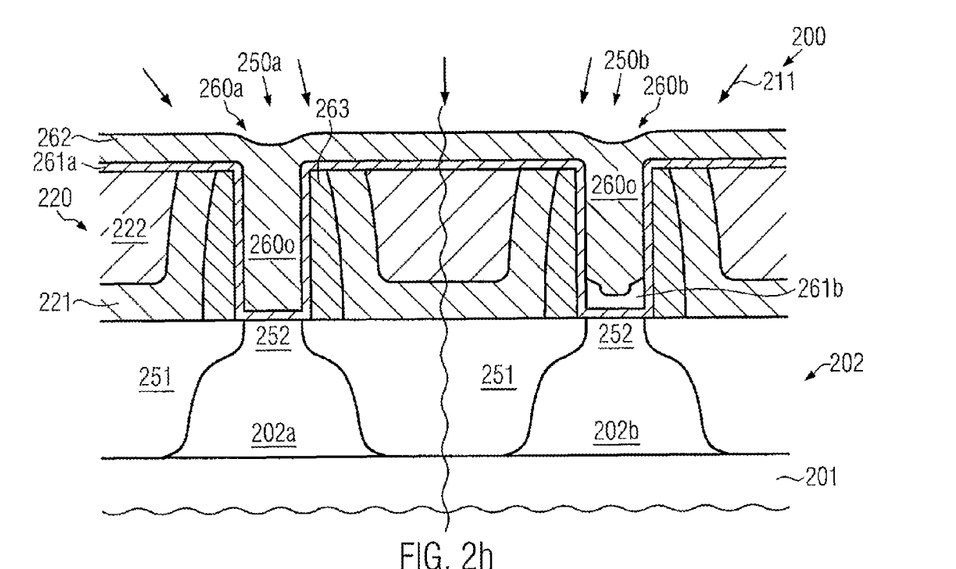

FIG. 2h schematically illustrates the device 200 in a further advanced manufacturing stage. As shown, a deposition process 211 may be performed so as to provide an electrode metal 262, such as aluminum, aluminum alloys and the like, in order to fill the gate openings 260o in a reliable manner. Due to the superior cross-sectional shape of the gate opening 260o in the gate electrode structure 260b, a reliable fill or at least a significant reduction of the probability of creating deposition-related irregularities may be achieved, even if a gate length of 30 nm and significantly less is to be implemented in the transistors 250a, 250b. Thus any appropriate deposition process, for instance electroless deposition and the like, may be used, wherein, in even less critical applications, a CVD-based deposition recipe may be applied in combination with the deposition of an appropriate seed layer, since the selective removal of the material 261b from the upper portion of the gate electrode structure 260b may provide additional process robustness. Since the material 261b is merely preserved as a bottom layer in the gate electrode structure 260b, a significantly larger amount of the material 262 may be filled into the gate electrode structure 260b compared to conventional strategies for an otherwise given geometry of the gate electrode structure 260b. Consequently, the overall gate resistance may be reduced, while at the same time ensuring highly uniform electronic characteristics of the gate electrode structures.

With reference to FIGS. 2i-2l, further illustrative embodiments will now be described, in which the electrode material under consideration may be used as a "fill material" that initially completely fills any type of gate electrode structures and which is then removed in a controlled manner so as to preserve a bottom layer and some of the gate electrode structures.

Figure 2I:
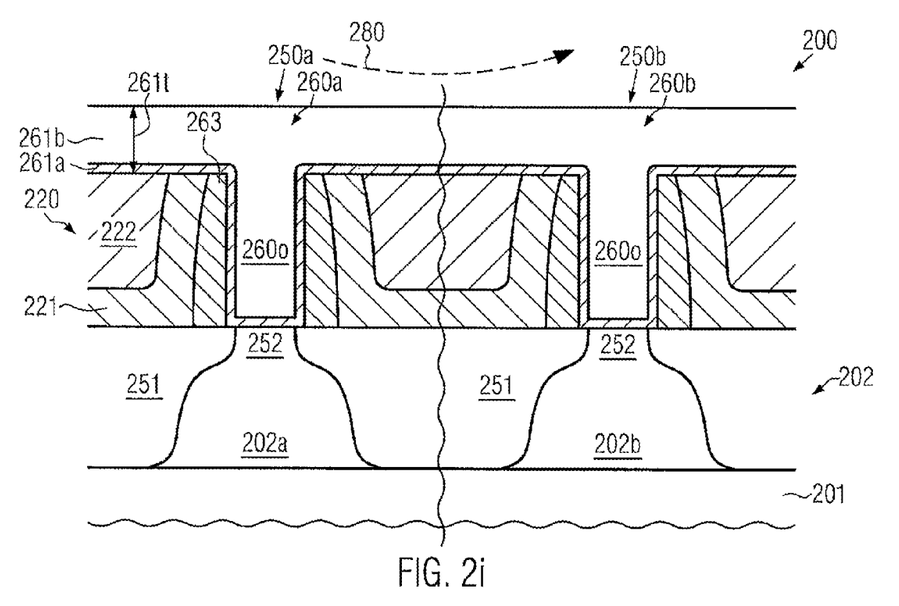
FIGS. 2*i*-2*l* schematically illustrate cross-sectional views of the semiconductor device during various manufacturing stages, wherein gate openings are completely filled with an electrode material, which may then be completely removed from one type of gate electrode structure while a well-defined bottom layer is preserved in the other type of gate electrode structure, according to illustrative embodiments.

FIG. 2i schematically illustrates the semiconductor device 200 in a manufacturing stage in which the electrode material 261b, required for adjusting the electronic characteristics of the gate electrode structure 260b, as discussed above, is formed in the gate openings 260o so as to completely fill these openings. To this end, the material 261b may be deposited on the basis of an appropriate deposition technique, such as ALD, with a target thickness 261t that ensures a complete filling of the openings 260o. In other cases, the material 261b may be deposited by electrochemical deposition techniques with a superior bottom-to-top fill behavior and the like. To this end, any well-established deposition recipes may be applied. In some illustrative embodiments, an additional planarization process 280 may be applied in order to obtain a substantially planner surface topography and adjust a thickness of excess material outside the gate openings 260o. To this end, any well-established CMP recipes and the like may be applied.

Figure 2J:
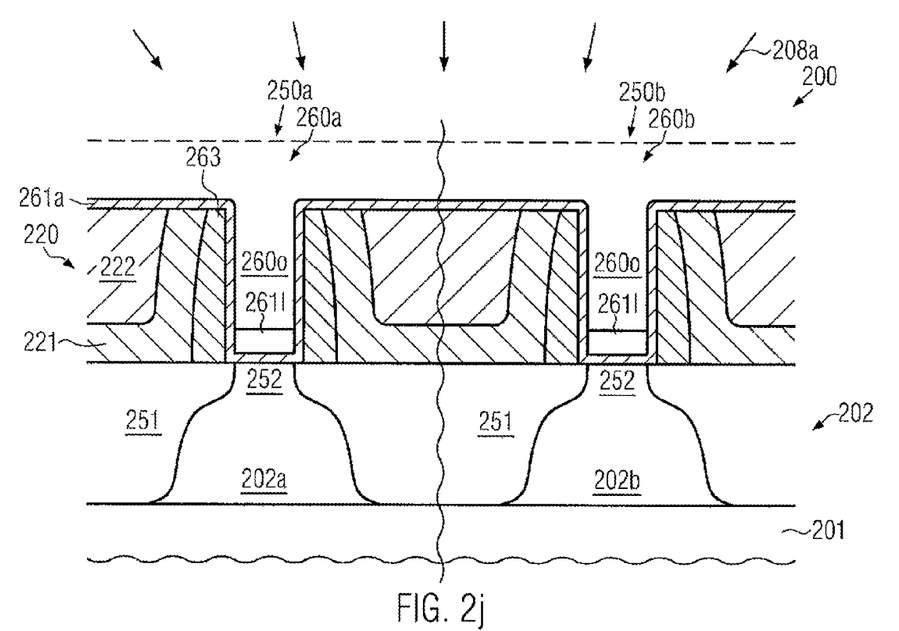

FIG. 2j schematically illustrates the semiconductor device 200 according to some illustrative embodiments when exposed to a reactive process atmosphere of an etch process 208a in order to remove a significant portion of the material 261b (FIG. 2i). To this end, similar etch recipes and chemical agents may be used as discussed above with reference to the etch process 208 (FIG. 2g). In the embodiment shown, the etch process 208a is controlled such that a bottom layer 261l is preserved, which provides the required electronic characteristics. The control of the etch process may be accomplished by controlling at least one process parameter, such as etch time, for otherwise given parameters. To this end, the removal rate during the etch process 208a may be determined in advance and, hence, for a given initial thickness of the electrode material, a desired minimum thickness of the bottom layer 261l may be achieved. It should be appreciated that a certain variation of the thickness of the bottom layer 261l may be acceptable, as long as the minimum desired thickness is not under-run.

Figure 2K:
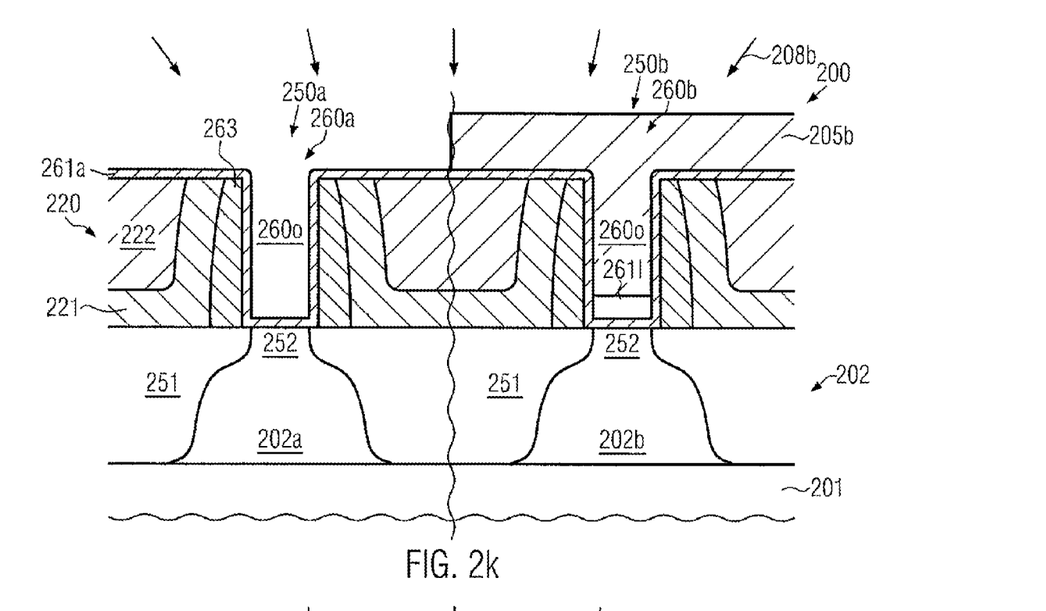

FIG. 2k schematically illustrates the semiconductor device 200 in a further advanced manufacturing stage, in which an etch mask 205b, such as a resist mask, possibly in combination with a planarization material, may be provided so as to expose the gate opening 260o of the first gate electrode structure 260a. To this end, any well-established lithography techniques may be applied. On the basis of the etch mask 205b, a further etch process 208b may be applied so as to remove the material 261b (FIG. 2i) completely from the gate electrode structure 260a without affecting the bottom layer 261l in the gate electrode structure 260b. The etch process 208be may be established on the basis of the same etch recipes as discussed above, while the material layer 261a still acts as an efficient etch stop material. Thereafter, the etch mask 205b may be removed, for instance, by wet chemical recipes, plasma assisted processes and the like, and the further processing may be continued by filling in an appropriate electrode metal, as is also discussed above. It should be appreciated that, in this case, the bottom layer 261l may be provided with a substantially uniform thickness, thereby also ensuring uniform electronic characteristics across the entire gate electrode structure 260b.

Figure 2L:
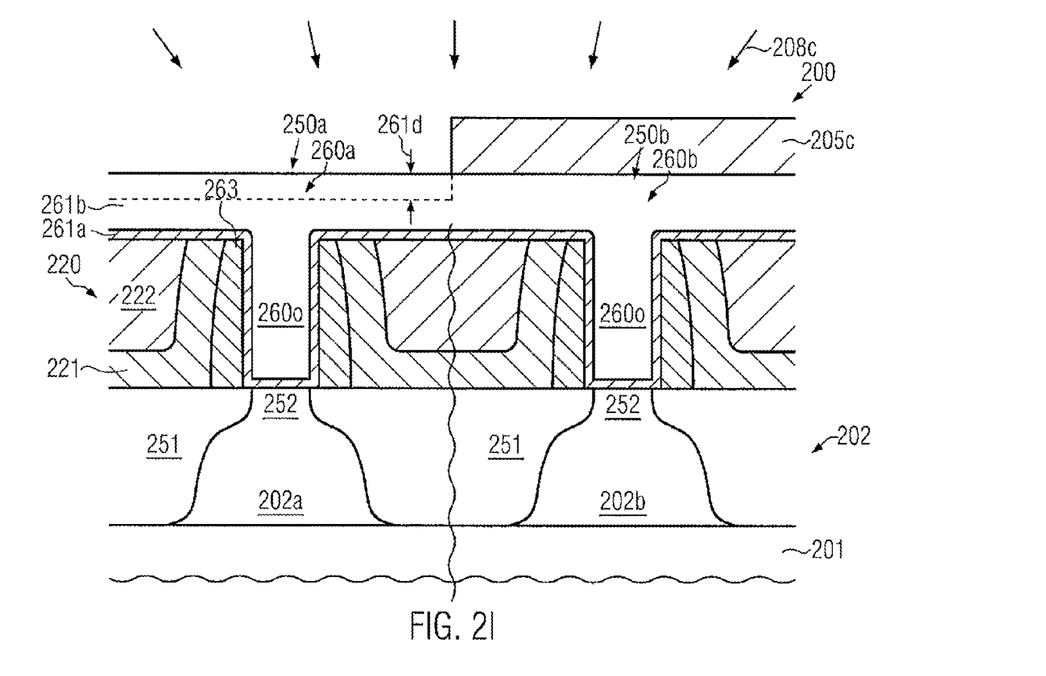

FIG. 2l schematically illustrates the semiconductor device 200 according to further illustrative embodiments in which the material 261b may be provided so as to completely fill the gate openings 260o, as already discussed above, wherein, however, an etch mask 205c may be provided so as to remove a portion 261d of the material 261b above the gate electrode structure 260a. To this end, an etch process 208c may be applied, for instance on the basis of etch recipes as discussed above, in order to selectively reduce the initial thickness of the material 261b, thereby enabling a subsequent removal process for the gate electrode structures 260a, 260b after the removal of the etch mask 205c. On the other hand, due to the removed portion 261d, the material 261b may be completely removed from the gate electrode structure 260a, while a desired thickness of a bottom layer may be preserved in the gate electrode structure 260b. It should be appreciated that the thickness 261d may be appropriately controlled so as to obtain a desired "etch lag" for the gate electrode structure 260b, which in turn ensures a desired thickness of a bottom layer, as for instance described with reference to FIG. 2k. Also in this case, the further processing may be continued, after providing a desired bottom layer in the gate electrode structure 260b, by filling in an appropriate electrode metal, such as the material of the layer 262 (FIG. 2h).

Figure 2M:
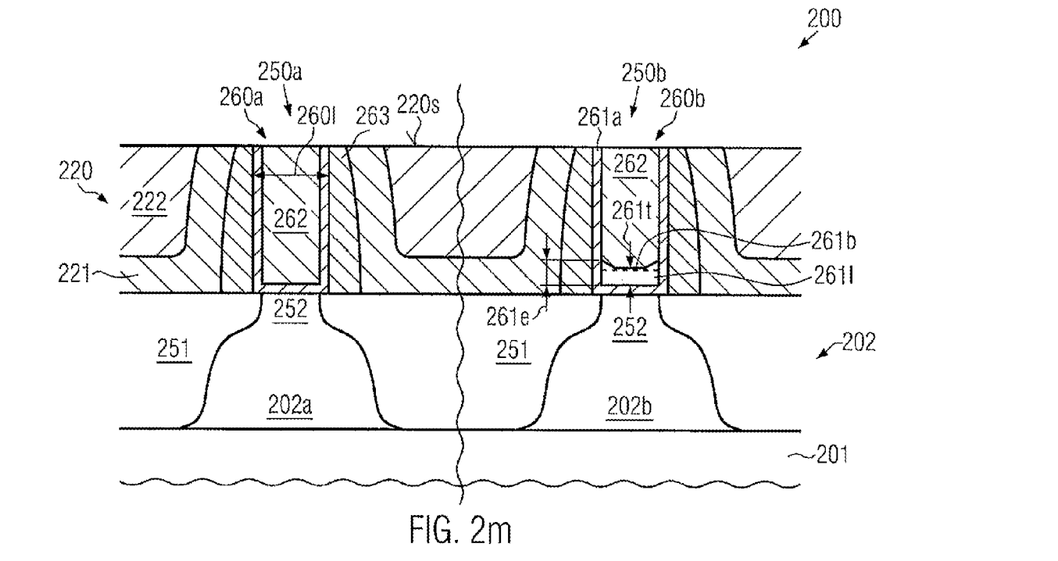
FIG. 2*m* schematically illustrates a cross-sectional view of the semiconductor device in a further advanced manufacturing stage, according to illustrative embodiments.

FIG. 2m schematically illustrates the device 200 in a further advanced manufacturing stage. As shown, any excess material of the layer 262 may be removed, for instance, by CMP, electro-etching, electro-CMP, etching and the like, thereby providing a substantially planar surface 220s in the contact level 220. Consequently, the gate electrode structures 260a, 260b may be provided with a substantially constant gate length, as indicated by 260l, along the entire height of the gate electrode structures, thereby providing superior conditions for the subsequent formation of contact elements and the like. That is, contrary to some conventional approaches, as previously discussed with reference to the device 100, a corner rounding of the gate openings so as to provide superior fill conditions may not be required so that a reduced lateral pitch between closely spaced gate electrode structures may be implemented, without causing undue leakage paths and contact failures. On the other hand, the preserved bottom layer 261b or the uniform bottom layer 261l still ensures the appropriate work function and general electronic characteristics of the gate electrode structure 260b.

As a result, the present disclosure provides manufacturing techniques and semiconductor devices in which the aspect ratio of critical gate openings may be reduced by selectively removing a metal-containing electrode material in a gate opening so as to preserve a bottom layer having at least a desired minimum thickness across the entire gate opening, thereby ensuring uniform electronic characteristics of the gate electrode structure, even for a gate length of 30 nm and less. Since the electrode material may be removed to a significant degree, except for the bottom layer, the available fill volume for the highly conductive electrode metal is significantly increased compared to conventional strategies, since the electrode material is also removed from most of the sidewall areas of the gate openings, thereby providing superior conductivity of the gate electrode structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    conformally forming a layer of a metal-containing electrode material with a first thickness in a gate opening of a first gate electrode structure of a first transistor and a gate opening of a second gate electrode structure of a second transistor;
    forming a sacrificial material selectively at a bottom of said gate opening of said second gate electrode structure, said sacrificial material having a second thickness that is less than three times said first thickness;
    removing a portion of said layer of a metal-containing electrode material from said gate opening of said first gate electrode structure while using said sacrificial material as an etch mask so as to preserve said layer of a metal-containing electrode material with said first thickness at said bottom of said gate opening of said second gate electrode structure;
    removing said sacrificial material from said gate opening of said second gate electrode structure; and
    forming a conductive fill material in said gate openings of said first and second gate electrode structures.

2. The method of claim 1, further comprising controlling said second thickness so as to be approximately two times said first thickness or greater.

3. The method of claim 1, wherein said first thickness is adjusted to be 4-8 nm.

4. The method of claim 1, wherein said gate openings of said first and second gate electrode structures have a depth of 35 nm or less.

5. The method of claim 1, wherein forming said sacrificial material comprises forming a first sacrificial layer in and above said first and second gate electrode structures, forming a second sacrificial layer above said first sacrificial layer and patterning said first and second sacrificial layers.

6. The method of claim 5, wherein patterning said first and second sacrificial layers comprises patterning said second sacrificial layer so as to preserve a portion thereof above said second gate electrode structure and performing an etch process so as to commonly remove said second sacrificial layer and a portion of said first sacrificial layer.

7. The method of claim 6, wherein performing said etch process comprises performing a plasma assisted etch process.

8. The method of claim 5, further comprising determining a removal rate upon patterning said first and second sacrificial layers formed above a first substrate and using said determined removal rate so as to adjust said thickness of said sacrificial material formed above at least one second substrate.

9. The method of claim 5, further comprising determining a removal rate upon patterning said first and second sacrificial layers formed above a substrate and using said determined removal rate so as to adjust said thickness of said sacrificial material formed above said substrate.

10. The method of claim 9, wherein a width of said gate openings is 40 nm or less.

11. A method, comprising:
    forming a gate opening in a first gate electrode structure and a second gate electrode structure of a semiconductor device;
    forming a first metal-containing material layer on surface areas of said gate opening of said first and second gate electrode structures;
    forming a second metal-containing material on said first metal-containing material layer so as to completely fill said gate openings of said first and second gate electrode structures;
    removing said second metal-containing material from said gate opening of said first gate electrode structure by using said first metal-containing electrode material layer as an etch stop;
    removing a portion of said second metal-containing electrode material from said gate opening of said second gate electrode structure so as to preserve a bottom layer of said second metal-containing electrode material; and
    forming an electrode metal on said first metal-containing material layer in said gate opening of said first gate electrode structure and on said bottom layer in said gate opening of said second gate electrode structure.

12. The method of claim 11, wherein removing said second metal-containing material comprises performing an etch process so as to commonly remove material of said second metal-containing electrode material from said gate openings and from said bottom layer, and removing said bottom layer selectively in said gate opening of said first gate electrode structure.

13. The method of claim 12, wherein removing said bottom layer selectively in said gate opening of said first gate electrode structure comprises filling said gate openings with a sacrificial material, removing said sacrificial material from said gate opening of said first gate electrode structure and performing an etch process by using said sacrificial material in said gate opening of said second gate electrode structure as an etch mask.

14. The method of claim 11, wherein removing said second metal-containing material from said gate opening of said first gate electrode structure and removing a portion of said second metal-containing electrode material from said gate opening of said second gate electrode structure comprises reducing a thickness of said second metal-containing electrode material above said first gate electrode structure and subsequently performing a non-masked etch process.

15. The method of claim 14, wherein reducing a thickness of said second metal-containing electrode material above said first gate electrode structure comprises forming an etch mask so as to expose said second metal-containing electrode material above said first gate electrode structure and performing a first etch process.

16. The method of claim 11, further comprising planarizing said second metal-containing electrode material prior to removing said second metal-containing electrode material from said opening of said first gate electrode structure.

17. The method of claim 11, wherein a thickness of said bottom layer is adjusted to 10 nm or less.

* * * * *